(12) United States Patent
Shen et al.

(10) Patent No.: US 11,880,087 B2
(45) Date of Patent: Jan. 23, 2024

(54) OPTICAL ELEMENT DRIVING MECHANISM

(71) Applicant: TDK TAIWAN CORP., Taoyuan (TW)

(72) Inventors: Wei-Jhe Shen, Taoyuan (TW);
Yu-Huai Liao, Taoyuan (TW);
Sheng-Zong Chen, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 218 days.

(21) Appl. No.: 17/459,853

(22) Filed: Aug. 27, 2021

(65) Prior Publication Data
US 2022/0066231 A1 Mar. 3, 2022

Related U.S. Application Data

(60) Provisional application No. 63/071,550, filed on Aug. 28, 2020.

(51) Int. Cl.
*G02B 27/64* (2006.01)
*G02B 7/00* (2021.01)
(Continued)

(52) U.S. Cl.
CPC .................. *G02B 7/04* (2013.01); *G01L 1/16* (2013.01); *G02B 7/003* (2013.01); *G02B 7/02* (2013.01); *G02B 7/09* (2013.01); *G02B 7/1821* (2013.01); *G02B 13/001* (2013.01); *G02B 26/0816* (2013.01); *G02B 26/0875* (2013.01); *G02B 27/0006* (2013.01); *G02B 27/646* (2013.01); *G03B 5/00* (2013.01); *G03B 17/12* (2013.01); *G06F 3/016* (2013.01);
(Continued)

(58) Field of Classification Search
CPC .......... G02B 7/003; G02B 7/023; G02B 7/18; G02B 7/1821; G02B 7/182; G02B 7/1828; G02B 7/02; G02B 13/001; G02B 13/0065; G02B 26/0875; G02B 26/0816; G02B 26/0883; G02B 27/646; G03B 5/00; G03B 5/02; G03B 5/06; G03B 2205/0069; H04N 23/54; H04N 23/55
See application file for complete search history.

(56) References Cited

U.S. PATENT DOCUMENTS

| 2018/0239161 A1* | 8/2018 | Seol | G02B 27/646 |
| 2019/0129197 A1* | 5/2019 | Kim | G02B 27/646 |

(Continued)

*Primary Examiner* — Derek S. Chapel
(74) *Attorney, Agent, or Firm* — Muncy, Geissler, Olds & Lowe, P.C.

(57) ABSTRACT

An optical element driving system is provided. The optical element driving system includes a fixed portion, a first movable portion, a second movable portion, a first driving assembly, a second driving assembly, and a connecting element. The first movable portion is used for moving relative to the fixed portion. The second movable portion is used for holding an optical element having a main axis, and is movable relative to the first movable portion. The first driving assembly is used for driving the first movable portion to move relative to the fixed portion in a first dimension. The second driving assembly is used for driving the second movable portion to move relative to the first movable portion in a second dimension. The connecting element connects the first movable portion and the second movable portion.

18 Claims, 17 Drawing Sheets

(51) Int. Cl.

| | | |
|---|---|---|
| *G03B 5/00* | (2021.01) | |
| *G02B 7/182* | (2021.01) | |
| *G02B 13/00* | (2006.01) | |
| *H04N 23/68* | (2023.01) | |
| *G02B 7/04* | (2021.01) | |
| *G02B 7/02* | (2021.01) | |
| *G02B 26/08* | (2006.01) | |
| *G01L 1/16* | (2006.01) | |
| *G06F 3/01* | (2006.01) | |
| *H03K 17/96* | (2006.01) | |
| *G03B 17/12* | (2021.01) | |
| *H02K 41/035* | (2006.01) | |
| *G02B 7/09* | (2021.01) | |
| *G02B 27/00* | (2006.01) | |
| *H04N 23/55* | (2023.01) | |
| *H10N 30/30* | (2023.01) | |

(52) U.S. Cl.
CPC ....... *H02K 41/0354* (2013.01); *H03K 17/964* (2013.01); *H04N 23/55* (2023.01); *H04N 23/685* (2023.01); *H10N 30/302* (2023.02); *G03B 2205/0069* (2013.01); *H02K 41/0356* (2013.01); *H03K 2217/96062* (2013.01)

(56) References Cited

U.S. PATENT DOCUMENTS

| | | | |
|---|---|---|---|
| 2019/0227259 A1* | 7/2019 | Hsu | G02B 6/0066 |
| 2020/0310149 A1* | 10/2020 | Kazuo | G03B 17/17 |
| 2020/0333622 A1* | 10/2020 | Fujisaki | G03B 17/17 |
| 2020/0363626 A1* | 11/2020 | Seo | G03B 5/06 |
| 2021/0033946 A1* | 2/2021 | Noriyuki | H04N 23/54 |
| 2021/0072530 A1* | 3/2021 | Tsai | H02K 11/33 |
| 2021/0181460 A1* | 6/2021 | Lee | G02B 7/1805 |
| 2022/0035174 A1* | 2/2022 | Wang | G02B 7/005 |

* cited by examiner

OPTICAL ELEMENT DRIVING MECHANISM

CROSS REFERENCE TO RELATED APPLICATIONS

This application claims the benefit of U.S. Provisional Application No. 63/071,550, filed on Aug. 28, 2020, the entirety of which is incorporated by reference herein.

BACKGROUND OF THE DISCLOSURE

Field of the Disclosure

The present disclosure relates to an optical element driving mechanism.

Description of the Related Art

As technology has developed, it has become more common to include image-capturing and video-recording functions into many types of modern electronic devices, such as smartphones and digital cameras. These electronic devices are used more and more often, and new models have been developed that are convenient, thin, and lightweight, offering more choice to consumers.

Electronic devices that have image-capturing or video-recording functions normally include a driving mechanism to drive an optical element (such as a lens) to move along its optical axis, thereby achieving auto focus (AF) or optical image stabilization (OIS). Light may pass through the optical element and may form an image on an optical sensor. However, the trend in modern mobile devices is to have a smaller size and a higher durability. As a result, how to effectively reduce the size of the driving mechanism and how to increase its durability has become an important issue.

SUMMARY OF DISCLOSURE

An optical element driving system is provided in some embodiments of the present disclosure. The optical element driving system includes a fixed portion, a first movable portion, a second movable portion, a first driving assembly, a second driving assembly, and a connecting element. The first movable portion is used for moving relative to the fixed portion. The second movable portion is used for holding an optical element having a main axis, and is movable relative to the first movable portion. The first driving assembly is used for driving the first movable portion to move relative to the fixed portion in a first dimension. The second driving assembly is used for driving the second movable portion to move relative to the first movable portion in a second dimension. The connecting element connects the first movable portion and the second movable portion.

In some embodiments, the second driving assembly includes a first transmission element disposed between the first movable portion and the second movable portion, used for transmitting a second driving force generated by the second driving assembly to the second movable portion.

In some embodiments, the first dimension and the second dimension are different. The transmission element moves in a third dimension, wherein the third dimension is different from the first dimension and the second dimension. In some embodiments, movement in the first dimension is a circular movement of the first movable portion relative to a first axis extending in a first dimension. In some embodiments, movement in the second dimension is a rotational movement of the second movable portion relative to a second axis extending in a second dimension.

In some embodiments, the first direction and the second direction are different. The second axis passes through the second movable portion. The main axis is not parallel to the first direction. The main axis is not parallel to the second direction. The optical element the second movable portion are arranged in the main axis.

In some embodiments, the first movable portion includes a frame. The second axis passes through the connecting element. The fixed portion includes a bottom, a first guiding element is disposed on the bottom, and the second movable portion is movably connected to the bottom through the first guiding element.

In some embodiments, the movable portion includes a holding element used for holding the optical element. The holding element includes a first recess and a second recess. The bottom includes a limiting portion, and at least a portion of the first guiding element is disposed in the limiting portion.

In some embodiments, a distance greater than zero is between the limiting portion and the holding element. The holding element has a first surface and the second surface. The first recess is at the first surface of the holding element. The second recess is at the second surface of the holding element. The first surface faces the bottom. The second surface faces the transmission element. The second surface faces the frame. The main axis passes through the first guiding element.

In some embodiments, the first surface and the second surface face different directions. The first surface is a curved surface with the first axis as the central axis. The first recess has a curved structure with the first axis as the central axis. The second recess has a curved structure with the first axis as the central axis. The first recess has a first radius of curvature when viewed in the second direction. The second recess has a second radius of curvature when viewed in the second direction. The first radius of curvature and the second radius of curvature are different.

In some embodiments, the holding element further includes a holding surface perpendicular to the main axis. In some embodiments, when the holding element moves in the second dimension relative to the first movable portion, the holding surface is perpendicular to the main axis.

In some embodiments, the first movable portion includes a frame. The frame includes a first side and a second side. A first guiding recess and a second guiding recess form on a first surface of the first side. A third guiding recess is formed on a second surface of the second side. The first guiding recess and the second guiding recess extend in a third direction. The third direction is different from the first direction and the second direction. In some embodiments, the third guiding recess has a curved structure with the second axis as the central axis.

In some embodiments, the fixed portion further includes a case and a sidewall. The first movable portion and the second movable portion are disposed in the case. The sidewall is disposed between the case and the first movable portion. At least a portion of the sidewall overlaps the frame in the first direction.

In some embodiments, the optical element driving mechanism further includes a second guiding element disposed in the third guiding recess, and a plurality of positioning element disposed between the sidewall and the frame.

In some embodiments, the third direction is perpendicular to the first direction and the second direction. A plurality of accommodating portion is formed on the second side of the frame. A plurality of positioning portions are formed on the sidewall. At least a portion of the positioning portions overlap the accommodating portion in the first direction. At least a portion of the positioning elements are disposed in the guiding portion and the positioning portions.

In some embodiments, the guiding elements have spherical structures. The second guiding elements have spherical structures. In some embodiments, at least a portion of the second guiding element is exposed from the frame when viewed from the third direction. At least a portion of the positioning element is exposed from the frame when viewed from the third direction.

In some embodiments, the transmission element includes a third surface and the fourth surface. The third surface and the fourth surface are opposite. A fourth guiding recess and a fifth guiding recess are formed on the third surface. A sixth guiding recess is formed on the fourth surface. In some embodiments, the third surface of the transmission element faces the first surface of the frame. At least a portion of the second recess of the holding element overlaps the sixth guiding recess of the transmission element in the second direction.

In some embodiments, gear or rack structures are provided in the second recess of the holding element and the sixth guiding recess of the transmission element and correspond to each other. In the second direction, the fourth guiding recess and the fifth guiding recess of the transmission element at least partially overlap the first guiding recess and the second guiding recess of the frame, respectively. At least a portion of the positioning elements expose from the positioning portions when viewed in the third direction.

In some embodiments, the optical element driving mechanism further includes a blocking element disposed on the frame, and a gasket disposed between the connecting element and the frame.

In some embodiments, when viewed in the second direction, at least a portion of the blocking element overlaps the transmission element. When viewed in the third direction, at least a portion of the blocking element overlaps the transmission element. When viewed in the third direction, at least a portion of the first guiding recess is exposed from the blocking element. When viewed in the third direction, at least a portion of the fourth guiding recess is exposed from the blocking element. When viewed in the third direction, at least a portion of the second guiding recess overlaps the blocking element. When viewed in the third direction, at least a portion of the fifth guiding recess overlaps the blocking element.

In some embodiments, the optical element driving mechanism further includes a first circuit element disposed on the fixed portion, a second circuit element disposed on the fixed portion, a first strengthen element disposed on the fixed portion, and a second strengthen element disposed on the fixed portion.

In some embodiments, in the first direction, at least a portion of the first circuit element overlaps the frame. In the second direction, at least a portion of the first circuit element overlaps the frame. In the first direction, at least a portion of the second circuit element overlaps the frame. In the second direction, at least a portion of the first circuit element overlaps the first strengthen element. In the first direction, at least a portion of the second circuit element overlaps the second strengthen element.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF DISCLOSURE

Figure 1:
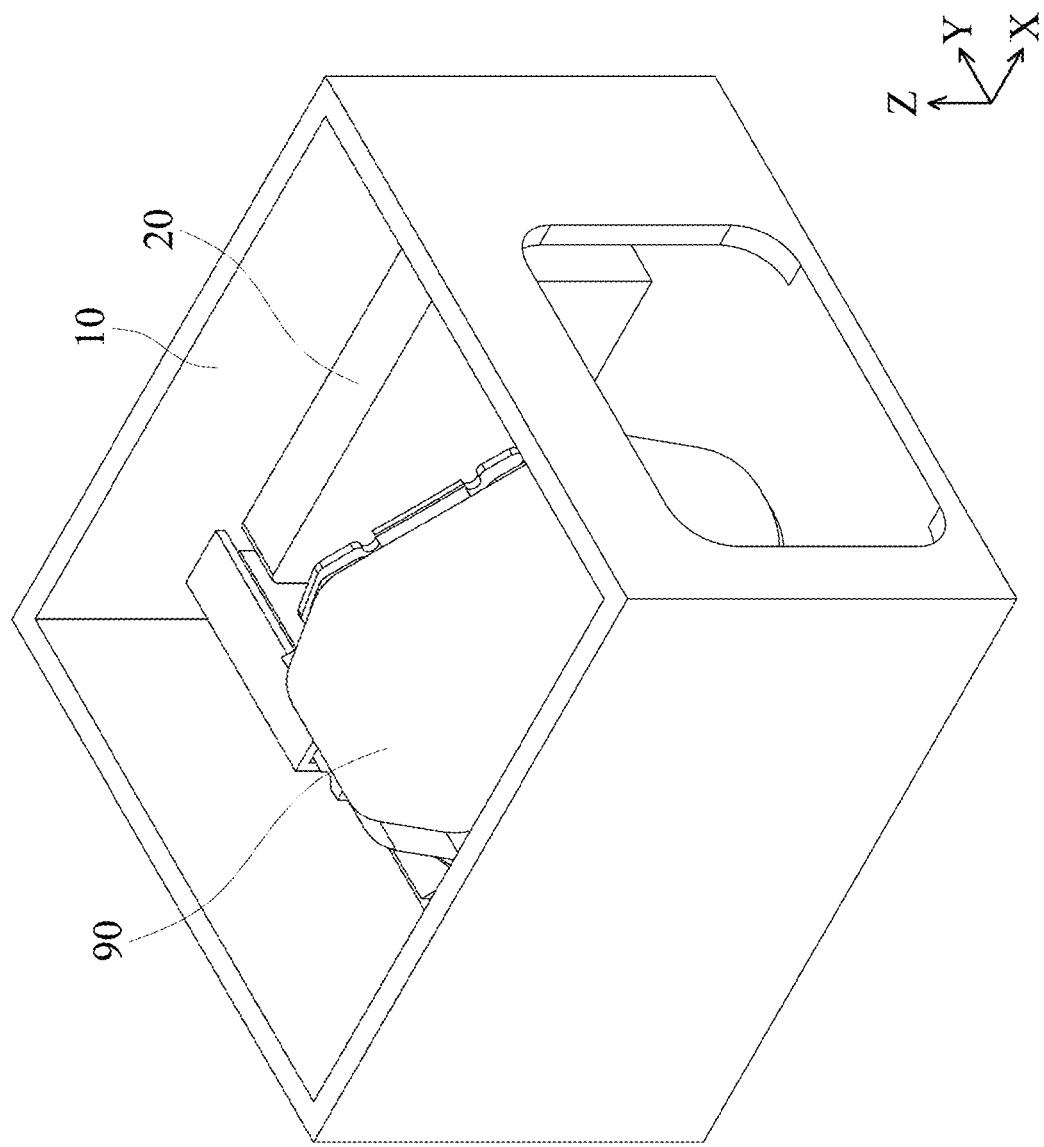
FIG. 1 is a schematic view of an optical element driving mechanism in some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are in direct contact, and may also include embodiments in which additional features may be disposed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations Moreover, the formation of a feature on, connected to, and/or coupled to another feature in the present disclosure that follows may include embodiments in which the features are in direct contact, and may also include embodiments in which additional features may be disposed interposing the features, such that the features may not be in direct contact. In addition, spatially relative terms, for example, "vertical," "above," "over," "below,", "bottom," etc. as well as derivatives thereof (e.g., "downwardly," "upwardly," etc.) are used in the present disclosure for ease of description of one feature's relationship to another feature. The spatially relative terms are intended to cover different orientations of the device, including the features.

Unless defined otherwise, all technical and scientific terms used herein have the same meaning as commonly understood by one of ordinary skill in the art to which this disclosure belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

In addition, in some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise.

Figure 2:
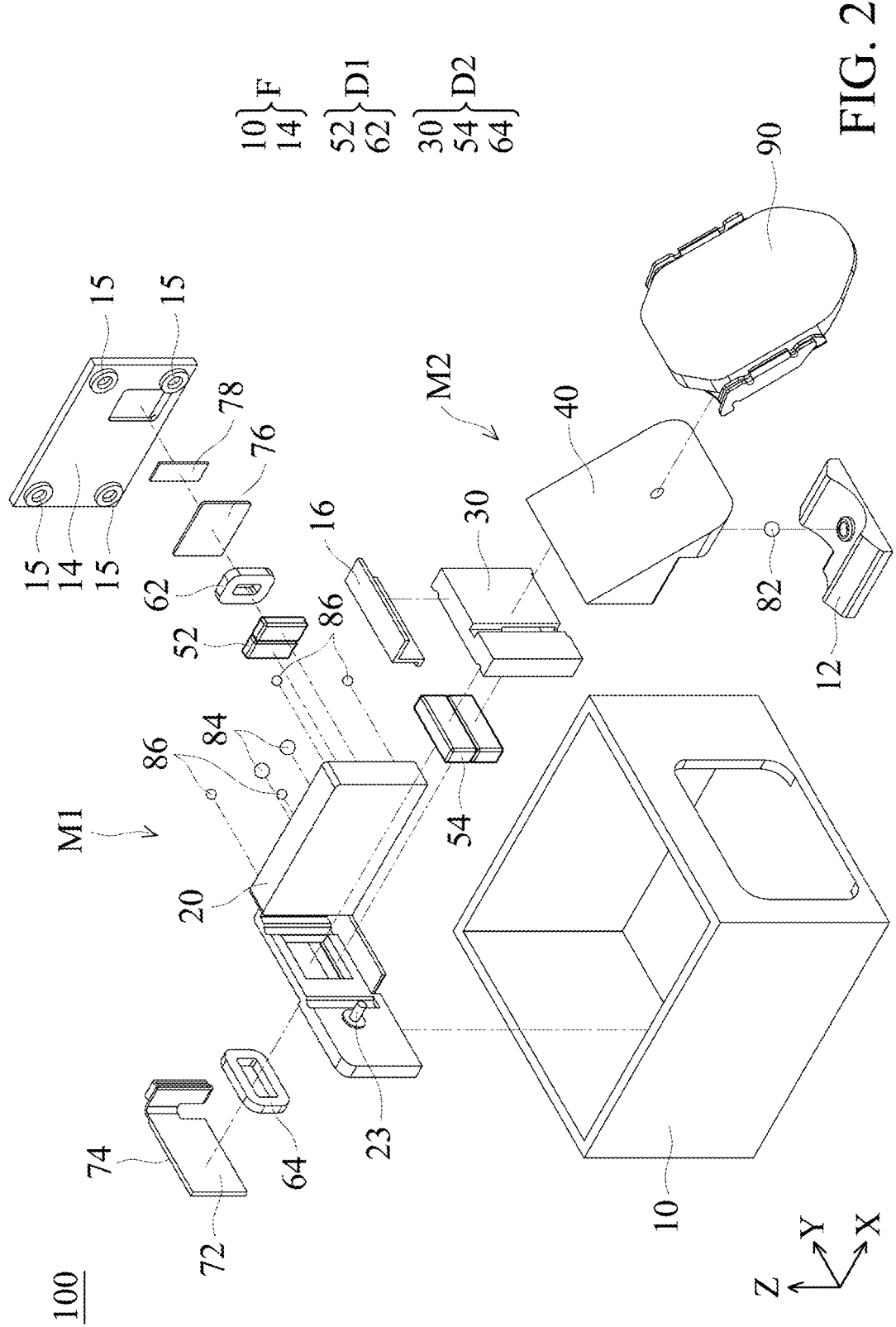
FIG. 2 is an exploded view of the optical element driving mechanism.
Figure 3:
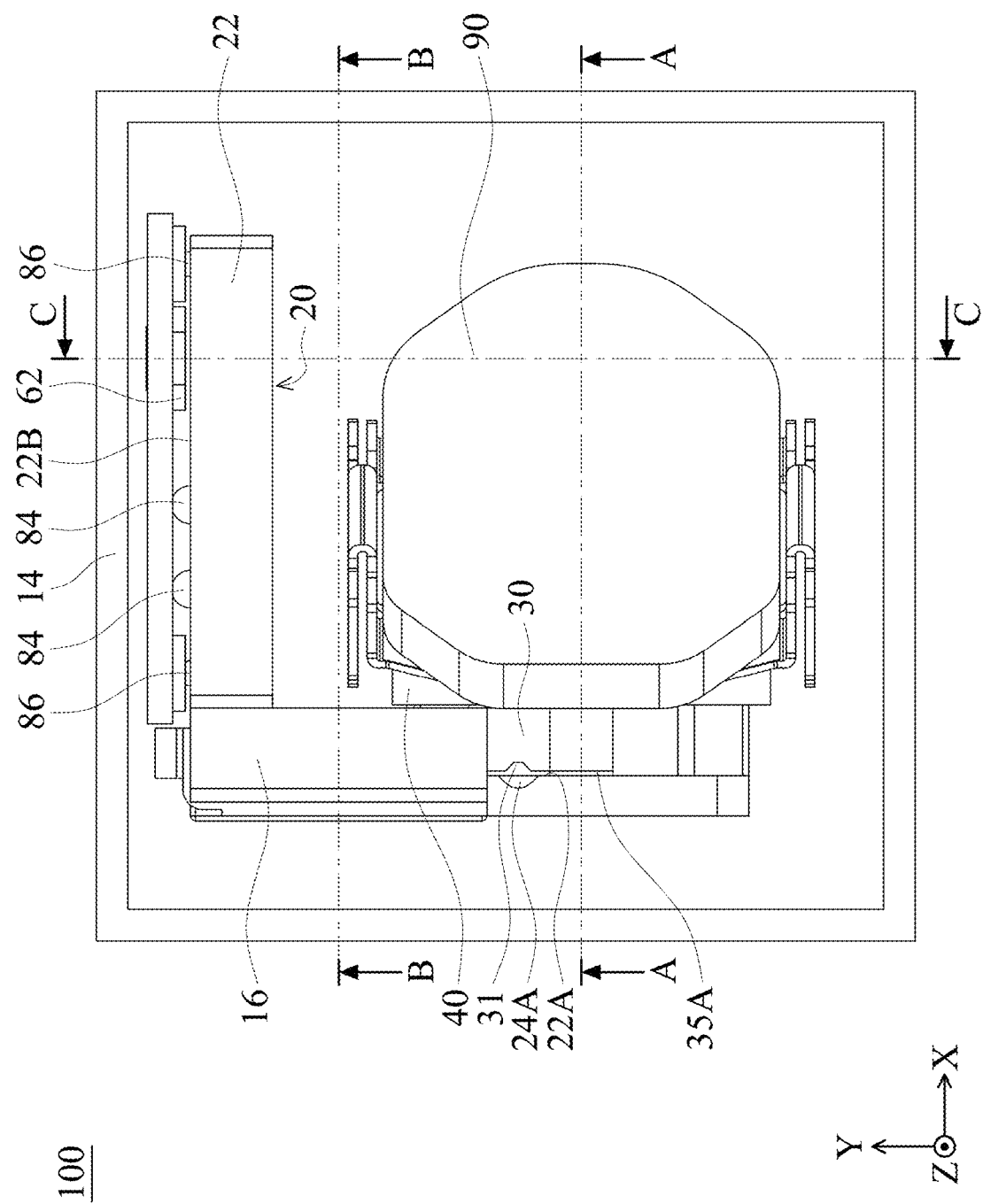
FIG. 3 is a top view of the optical element driving mechanism.
Figure 4A:
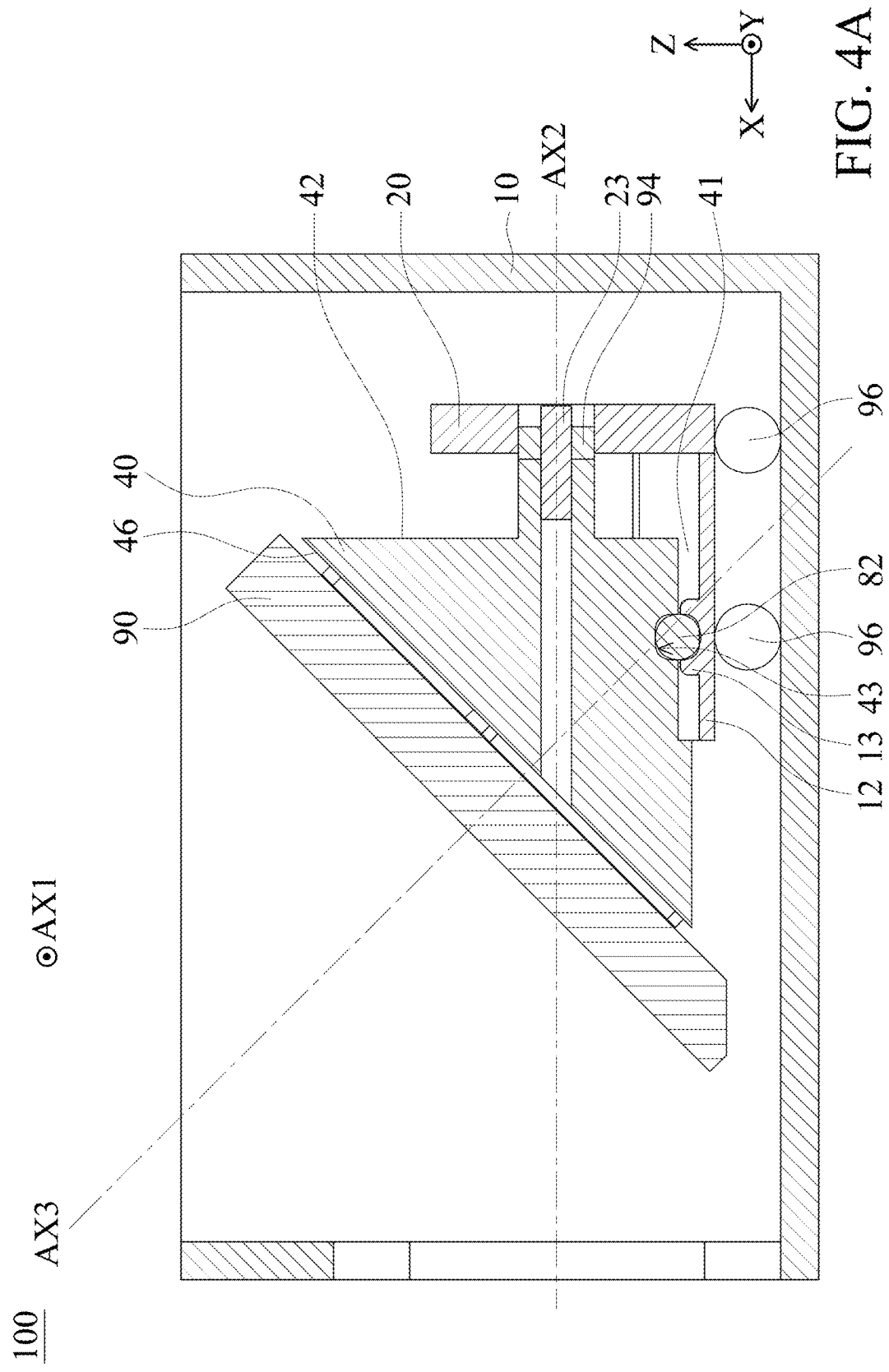
FIG. 4A is a cross-sectional view illustrated along line A-A in FIG. 3.
Figure 4B:
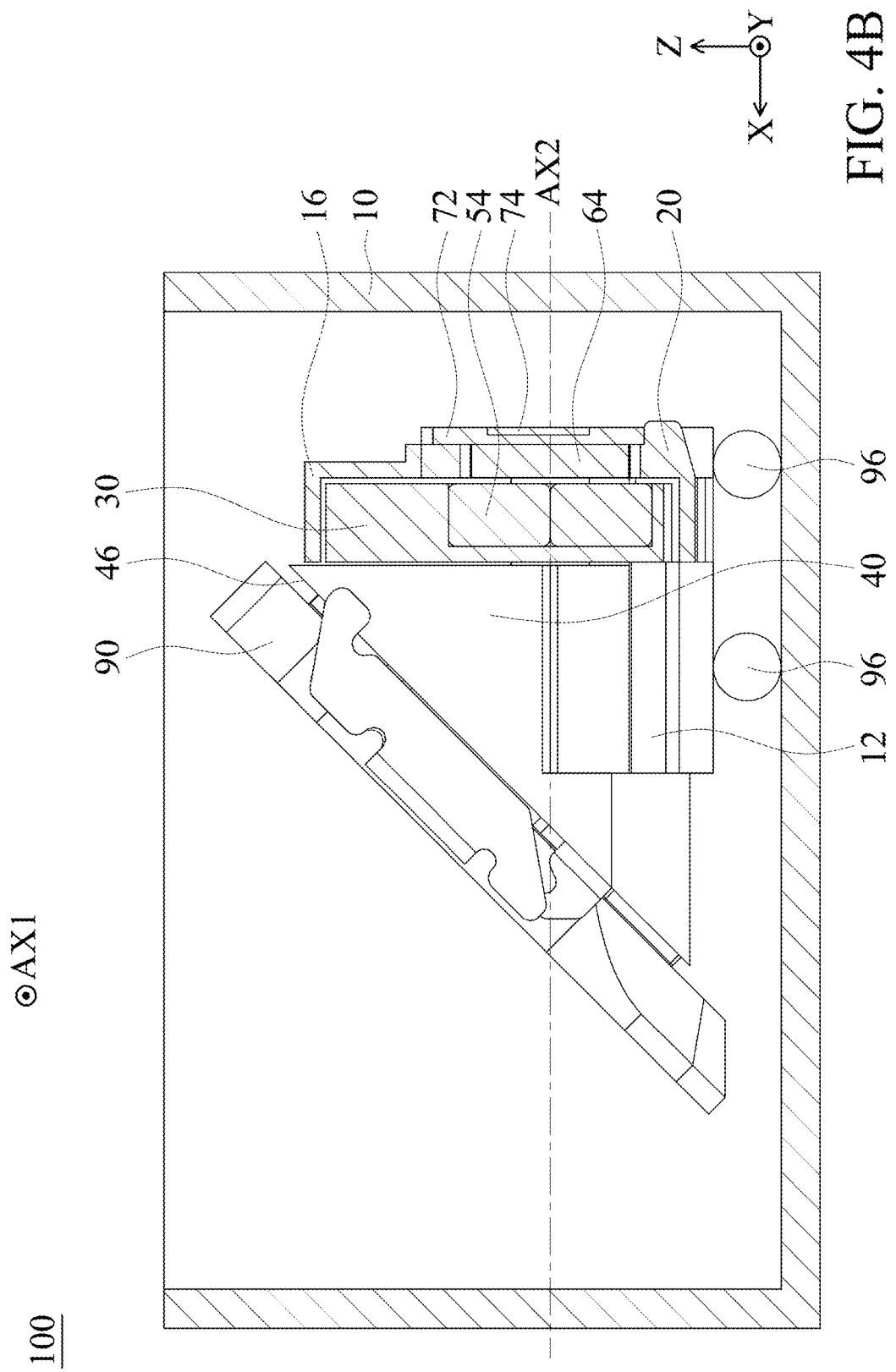
FIG. 4B is a cross-sectional view illustrated along line B-B in FIG. 3.
Figure 5:
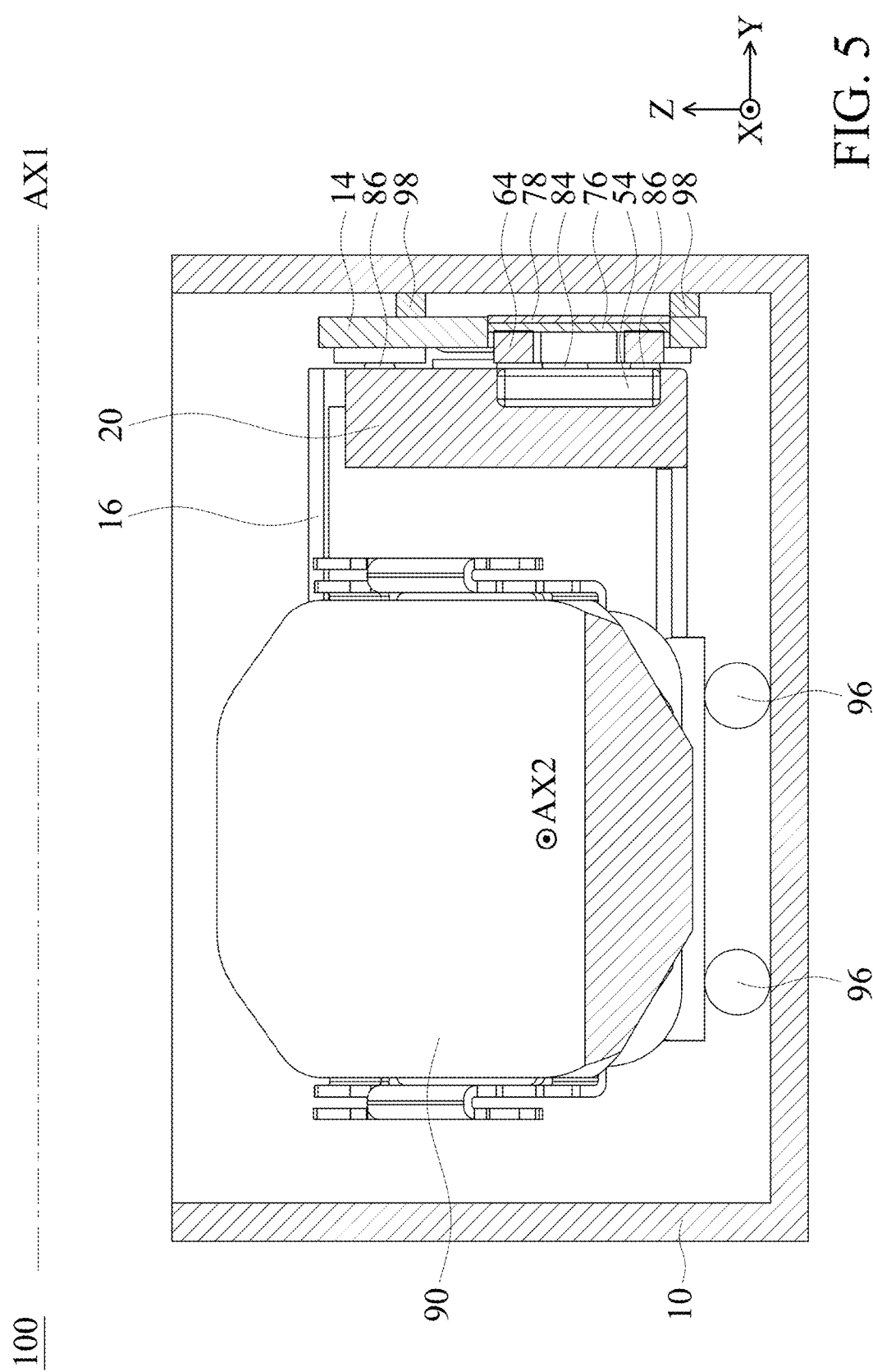
FIG. 5 is a cross-sectional view illustrated along line C-C in FIG. 3.

FIG. 1 is a schematic view of an optical element driving mechanism 100 in some embodiments of the present disclosure. FIG. 2 is an exploded view of the optical element driving mechanism 100. FIG. 3 is a top view of the optical element driving mechanism 100. FIG. 4A is a cross-sectional view illustrated along line A-A in FIG. 3. FIG. 4B is a cross-sectional view illustrated along line B-B in FIG. 3. FIG. 5 is a cross-sectional view illustrated along line C-C in FIG. 3.

In some embodiments, the optical element driving mechanism 100 mainly includes a case 10, a bottom 12, a sidewall 14, a blocking element 16, a frame 20, a transmission element 30, a holding element 40, a first magnetic element 52, a second magnetic element 54, a first coil 62, a second coil 64, a first circuit element 72, a first strengthen element 74, a second circuit element 76, a second strengthen element 78, a first guiding element 82, a second guiding element 84, and a positioning element 86.

In some embodiments, the optical element driving mechanism 100 may be used for driving an optical element 90, or may be used for driving different optical elements, such as a lens, a mirror, a prism, a beam splitter, an aperture, a liquid lens, an image sensor, a camera module, or a ranging module. It should be noted that the definition of the optical element is not limited to the element that is related to visible light, and other elements that relate to invisible light (e.g. infrared or ultraviolet) are also included in the present disclosure.

In some embodiments, the case 10 and the sidewall 14 may be called as a fixed portion F. The bottom 12 and the frame 20 may be called as a first movable portion M1 used for moving relative to the fixed portion F. The holding element 40 may also be called as a second movable portion M2, used for holding the optical element 90 having a main axis AX3, and may move relative to the first movable portion M1. The first magnetic element 52 and the first coil 62 may be called as a first driving assembly D1 used for driving the first movable portion M1 to move relative to the fixed portion F in a first dimension, such a circular movement relative to a first axis AX1. The first axis AX1 extends in a first direction (e.g. Y direction), and the first axis AX1 does not pass through the optical element driving mechanism 100.

In some embodiments, the transmission element 30, the second magnetic element 54, and the second coil 64 may be called as a second driving assembly D2 used for driving the second movable portion M2 to move relative to the first movable portion M1 in a second dimension, such as a rotational movement relative to the second axis AX2. The second axis AX2 extends in a second direction (e.g. the X direction). In some embodiments, the first dimension and the second dimension are different. The first direction and the second direction are different. Therefore, optical image stabilization (OIS) may be achieved. In some embodiments, the aforementioned elements (e.g. the first movable portion M1, the second movable portion M2, the first driving assembly D1, and the second driving assembly D2) may be disposed in the case 10 to be protected.

In some embodiments, a connecting element 23 may be used for connecting the first movable portion M1 and the second movable portion M2, such as connecting the frame 20 and the holding element 40. For example, the connecting element 23 may be an axis, and the second axis AX2 pass through the connecting element 23 to allow the second movable portion M2 rotate with the second axis AX2 as its rotational axis relative to the first movable portion M1. In some embodiments, a gasket 94 may be provided between the frame 20 and the connecting element 23 to affix the relative position between the frame 20 and the connecting element 23.

In some embodiments, a first guiding element 82 may be used for connecting the first movable portion M1 and the second movable portion M2, such as movably connect the bottom 12 and the holding element 40. In some embodiments, the first guiding element 82 may be spherical, and may scroll or slide relative to the holding element 40, so the friction between the holding element 40 (the second movable portion M2) and the bottom 12 (the first movable portion M1) when the holding element 40 is rotating in the second axis AX2 may be reduced.

In some embodiments, the bottom 12 may have a limiting portion 13 protruding to the holding element 40, and the first guiding element 82 may be at least partially disposed in the limiting portion 13, such as may be affix in the limiting portion 13 or rotateably disposed in the limiting portion 13, depending on design requirement. In some embodiments, the limiting portion 13 does not in direct contact with the holding element 40, such as a distance greater than zero is between the limiting portion 13 and the holding element 40. Moreover, the case 10 and the bottom 12 may be connected by connecting element 96, and the case 10 and the sidewall 14 may be connected by connecting element 98. The connecting element 96 may be balls or springs, so the first movable portion M1 (e.g. the bottom 12) may be movably connected to the fixed portion F (e.g. the case 10) to achieve optical image stabilization.

Figure 6:
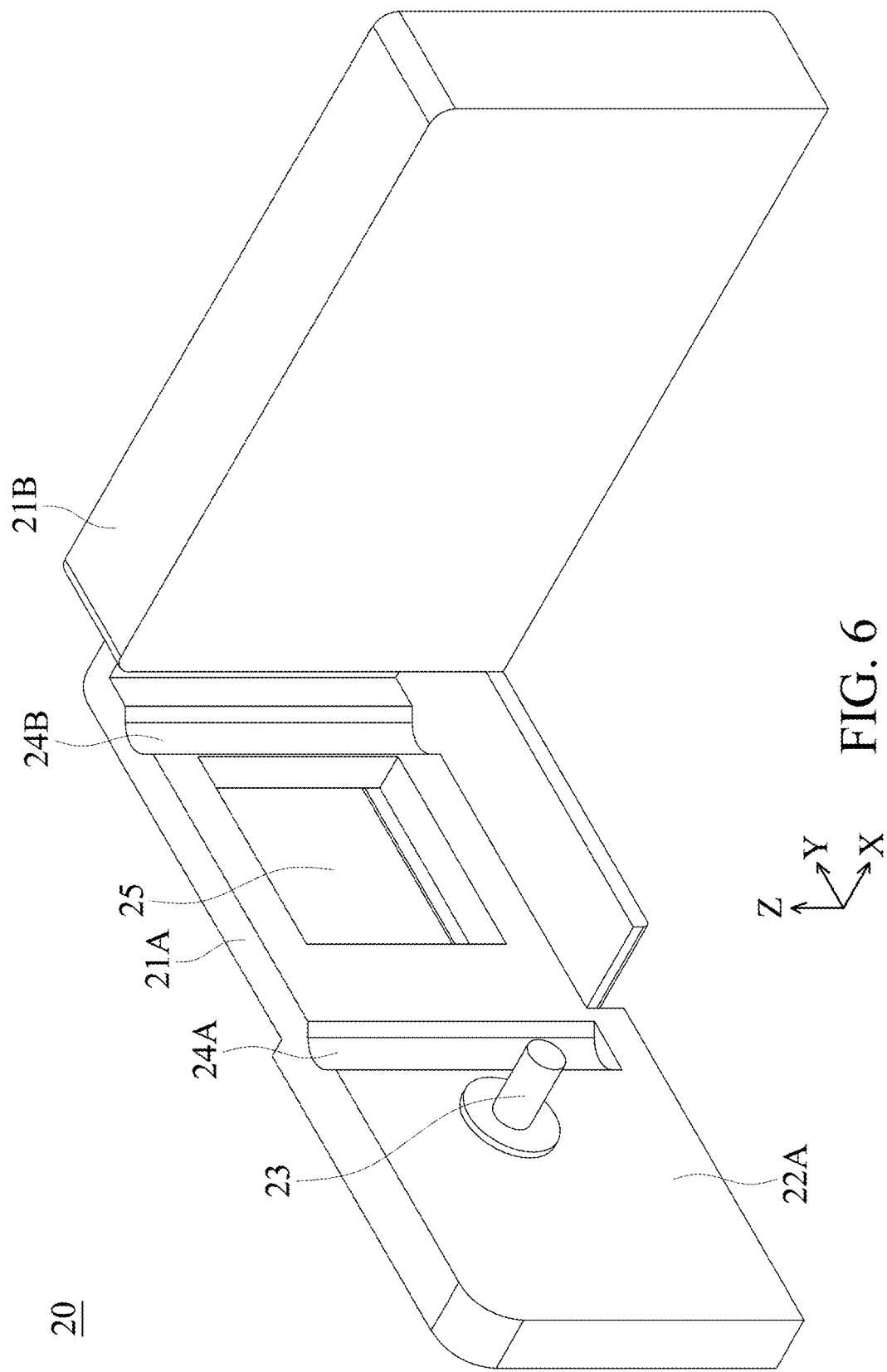
FIG. 6 and FIG. 7 are schematic views of the frame viewed in different directions.
Figure 7:
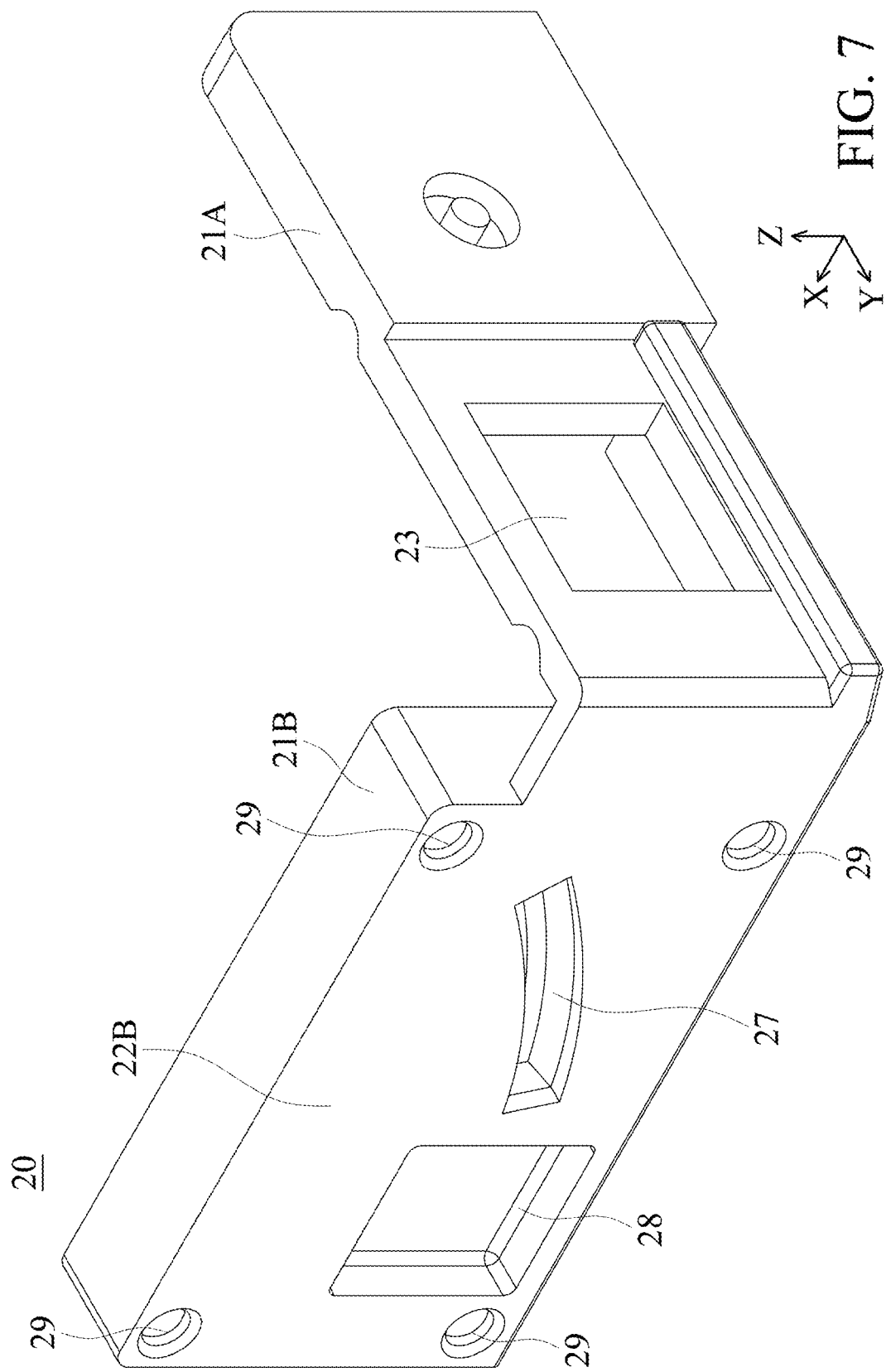

FIG. 6 and FIG. 7 are schematic views of the frame 20 viewed in different directions. The frame 20 may include a first side 21A and a second side 21B. The first side 21A and the second side 21B may be plate-shaped, and may extend in different directions. For example, the first side 21A may have a first surface 22A, and the second side 21B may have a second surface 22B. The first surface 22A may be perpendicular to the second direction (the X direction), and the second surface 22B may be perpendicular to the first direction (the Y direction).

The connecting element 23 may be disposed on the first side 21A. Moreover, a first guiding recess 24A and a second guiding recess 24B extending in the third direction (the Z direction) may be formed on the first surface 22A. In some embodiments, the third direction is different to the first direction and the second direction. An opening 25 may be formed on the first side 21A, and the second magnetic element 54 may be disposed in the opening 25.

A third guiding recess 27 may form at the second surface 22B of the second side 21B, and may be arc-shaped, wherein the first axis AX1 is its central axis. The third guiding recess 27 may be used for disposing the spherical second guiding element 84, so the frame 20 (the first movable portion M1) may move relative to the fixed portion F in the third guiding recess 27 (i.e. the circular movement with the first axis AX1 as its axis). A recess 28 may form on the second surface 22B, and the second magnetic element 54 may be disposed in the recess 28.

In some embodiments, the sidewall 14 may be disposed between the case 10 and the first movable portion M1. In the first direction (the Y direction), at least a portion of the sidewall 14 overlaps the frame 20. Moreover, accommodating portion 29 may be formed on the second surface 22B, and positioning portions 15 may be formed on the sidewall 14. At least a portion of the positioning portions 15 overlaps the accommodating portion 29 in the first direction (the Y direction), so the spherical positioning element 86 may be disposed between the sidewall 14 and the frame 20. As a result, the movement of the first movable portion M1 relative to the fixed portion F may be defined. In some embodiments, when viewed in the third direction (the Z direction), at least a portion of the second guiding element 84 and the positioning element 86 expose from the transmission element 30, and at least a portion of the positioning element 86 exposes from the positioning portions 15. Therefore, the required thickness of the positioning portions 15 and the frame 20 may be reduced to achieve miniaturization.

Figure 8:
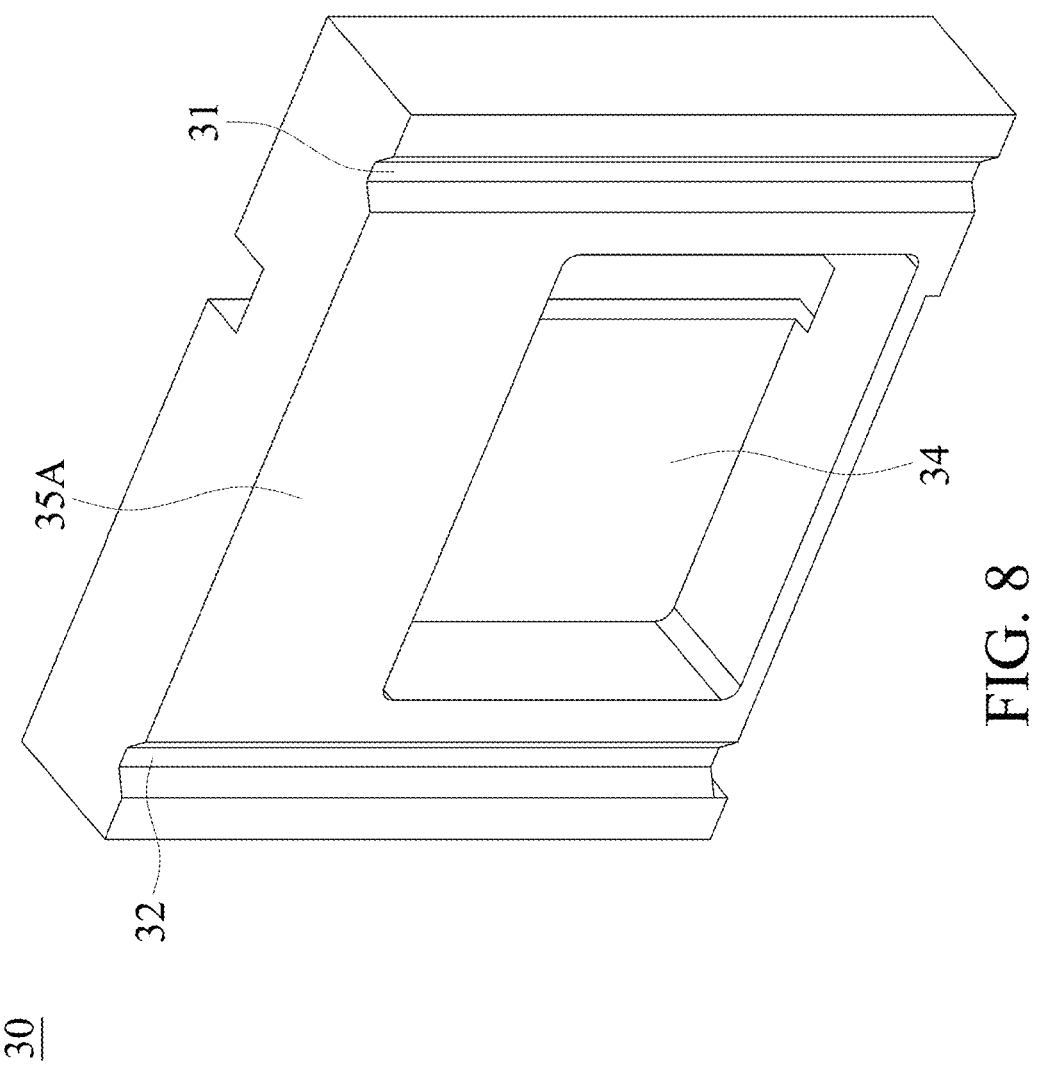
FIG. 8 and FIG. 9 are schematic views of the transmission element viewed in different directions.
Figure 9:
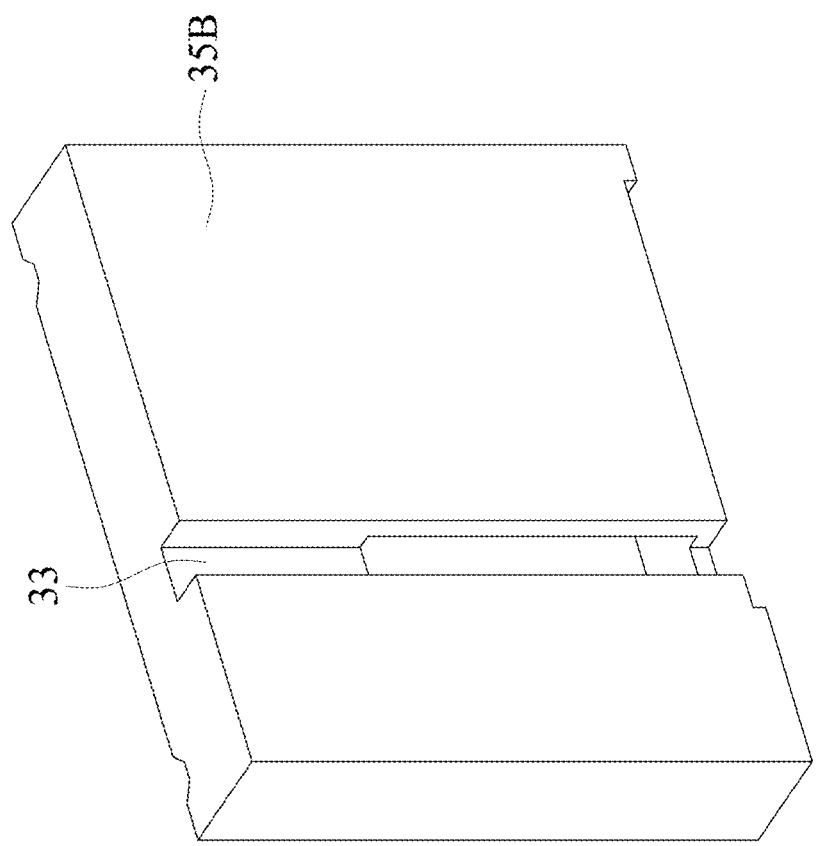

FIG. 8 and FIG. 9 are schematic views of the transmission element 30 when viewed in different directions. The transmission element 30 may have a third surface 35A and a fourth surface 35B opposite from each other, and a fourth guiding recess 31, a fifth guiding recess 32, and a recess 34 may form on the third surface 35A. A sixth guiding recess 33 may form on the fourth surface 35B. The fourth guiding recess 31, the fifth guiding recess 32, and the sixth guiding recess 33 may extend in an identical direction, such as the third direction (the Z direction). Therefore, the transmission element 30 may move in the third direction.

Figure 10:
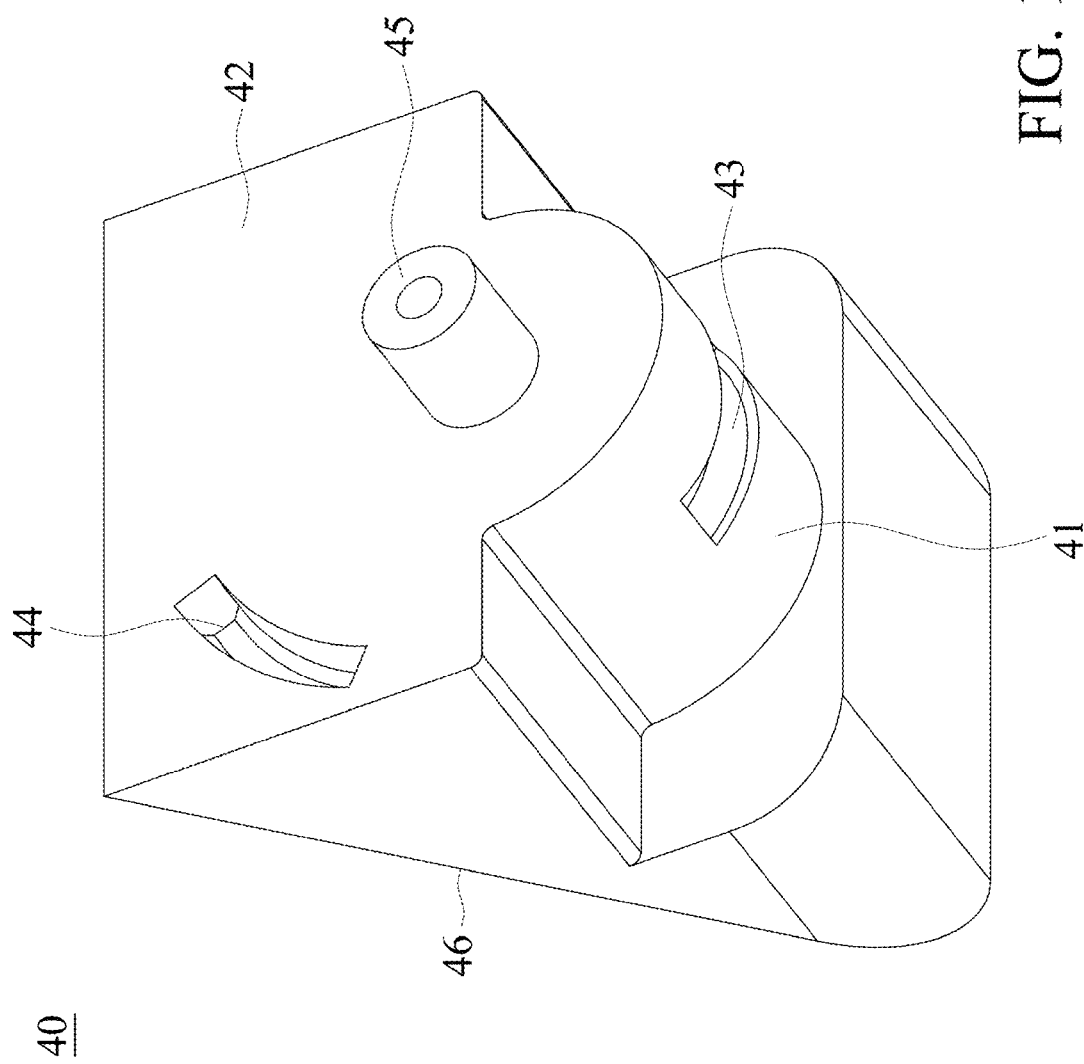
FIG. 10 is a schematic view of the holding element.

FIG. 10 is a schematic view of the holding element 40. The holding element 40 may include a first surface 41 and a second surface 42. The first recess 43 is formed on the first surface 41 of the holding element 40, and the second recess 44 is formed on the second surface 42 of the holding element 40. In some embodiments, the first surface 41 faces the bottom 12, and the second surface 42 faces the frame 20 or the transmission element 30. In other words, the first surface 41 and the second surface 42 may face different directions. In some embodiments, the first surface 41 may have a curved surface with the second axis AX2 as its central axis. Moreover, the second recess 44 may use the second axis AX2 as its central axis. Therefore, the holding element 40 may rotate with the second axis AX2 as its rotational axis.

For example, a connecting portion 45 may be formed on the holding element 40, and the connecting element 23 may be disposed in the connecting portion 45. Therefore, the second axis AX2 may pass through the connecting portion 45. Moreover, the holding element 40 may have a holding surface 46, and the optical element 90 may be disposed on the holding surface 46. The holding surface 46 may be perpendicular to the main axis AX3 of the optical element 90. For example, the main axis AX3 may pass through the center of the optical element 90, and is not parallel to the first direction (the Y direction) and the second direction (the X direction). Therefore, the optical element 90 and the second movable portion M2 may arrange in the main axis AX3. It should be noted that when the holding element 40 moves in the second dimension relative to the first movable portion M1, the holding surface 46 is perpendicular to the main axis AX3 to ensure the light reflected by the optical element 90 is stable. In some embodiments, the main axis AX3 passes through the first guiding element 82.

Figure 11:
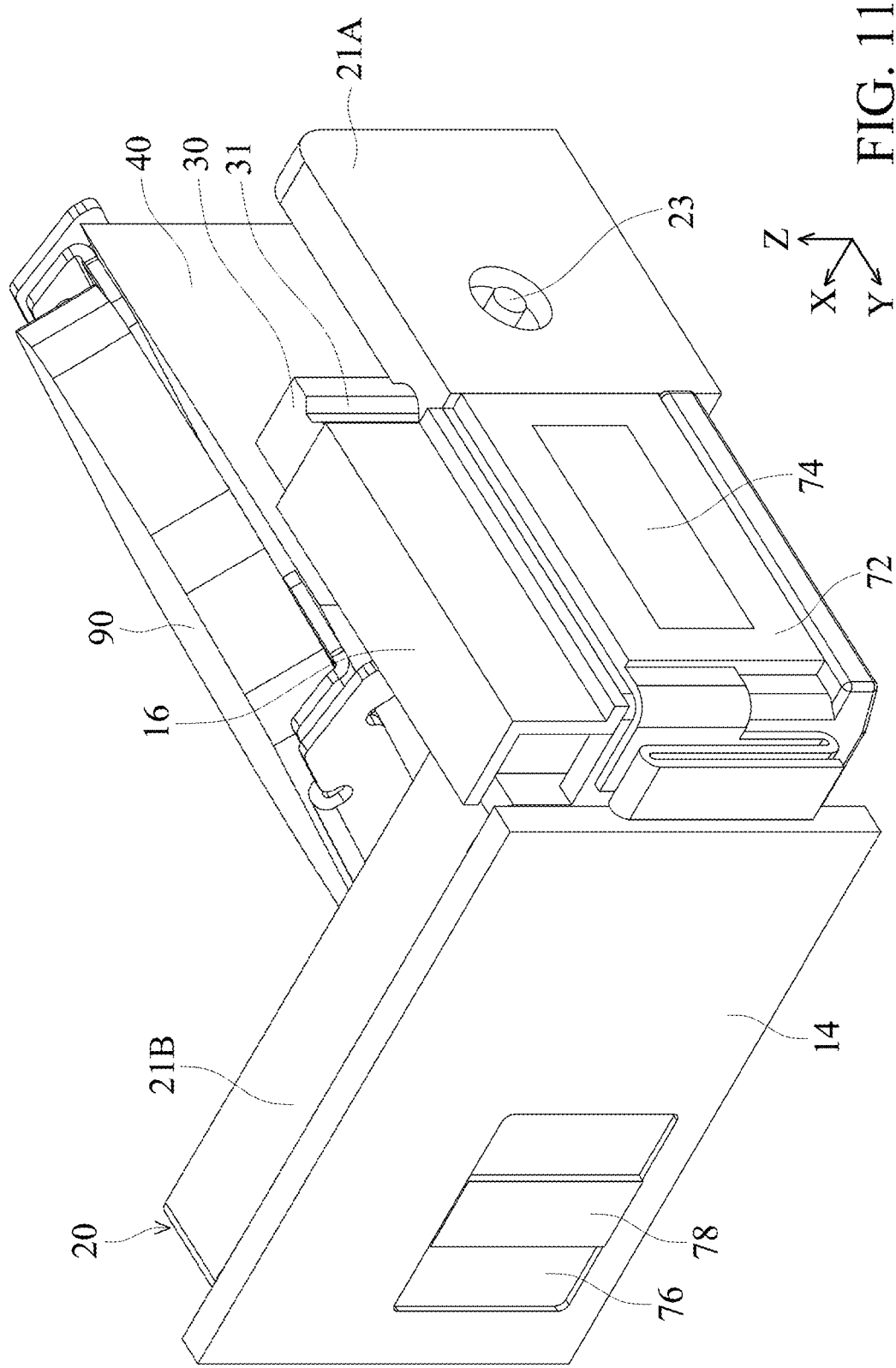
FIG. 11 and FIG. 12 are schematic views of some elements of the optical element driving mechanism viewed in different directions.
Figure 12:
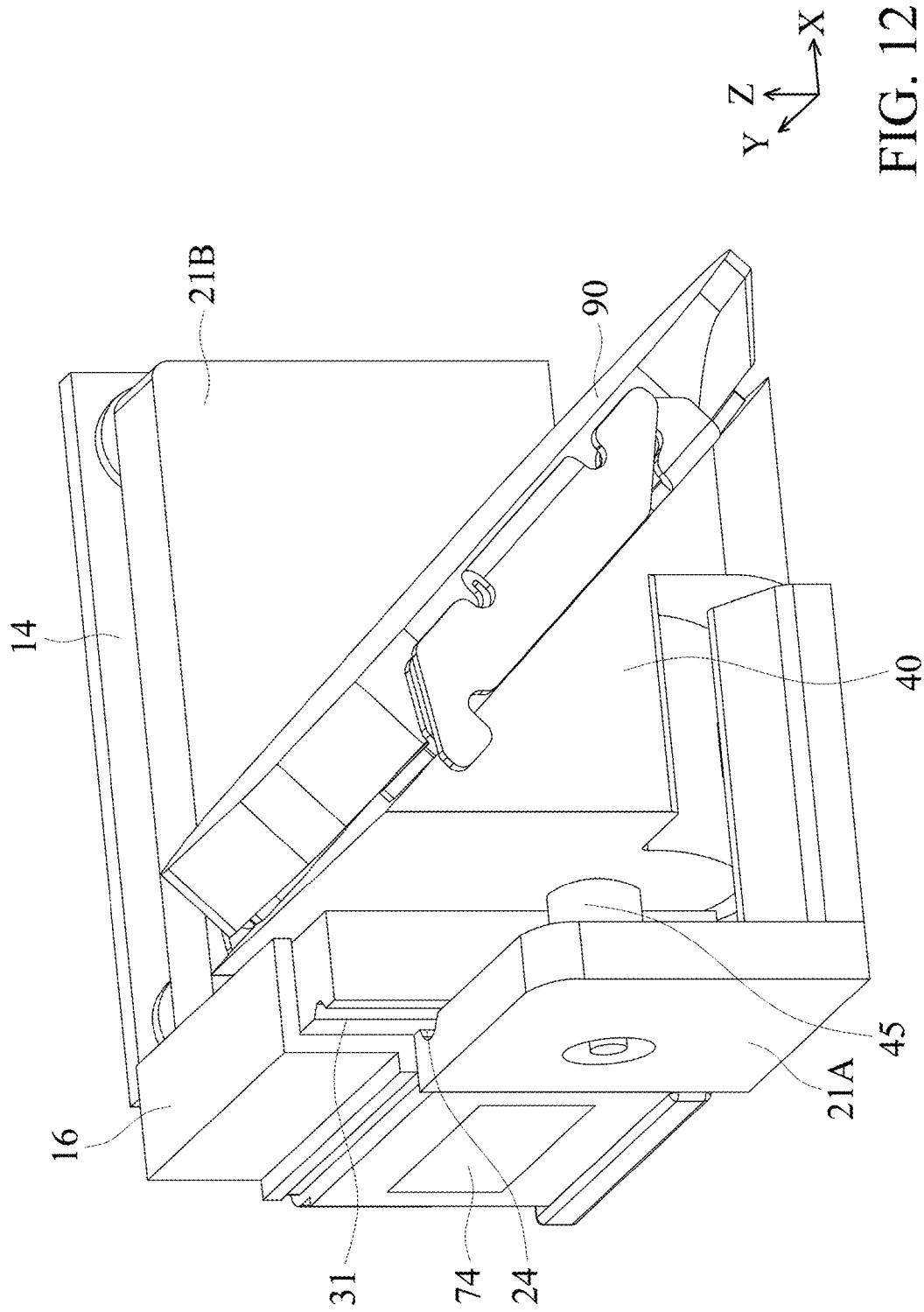
Figure 13:
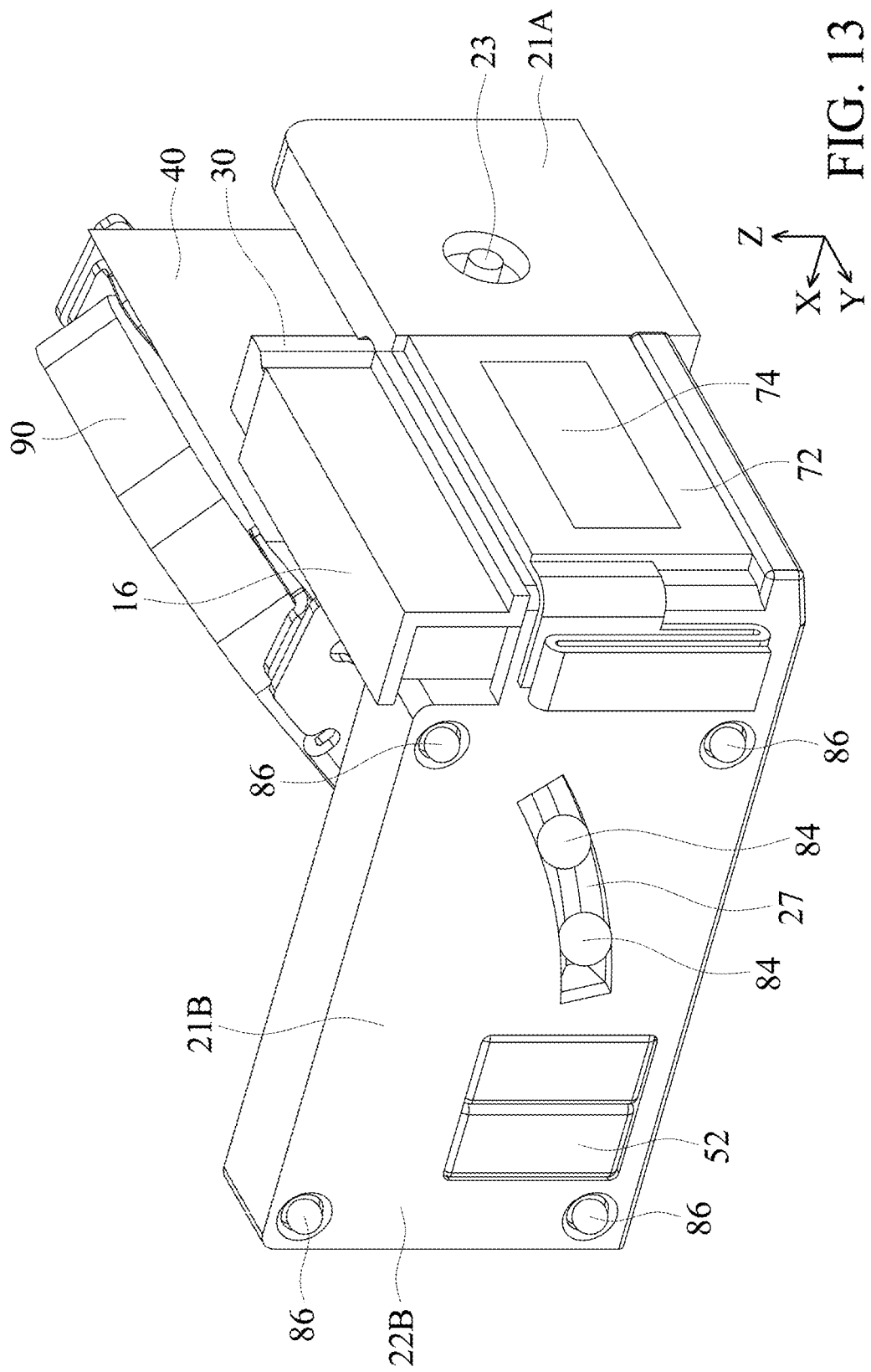
FIG. 13 and FIG. 14 are schematic views of some elements of the optical element driving mechanism viewed in different directions.
Figure 14:
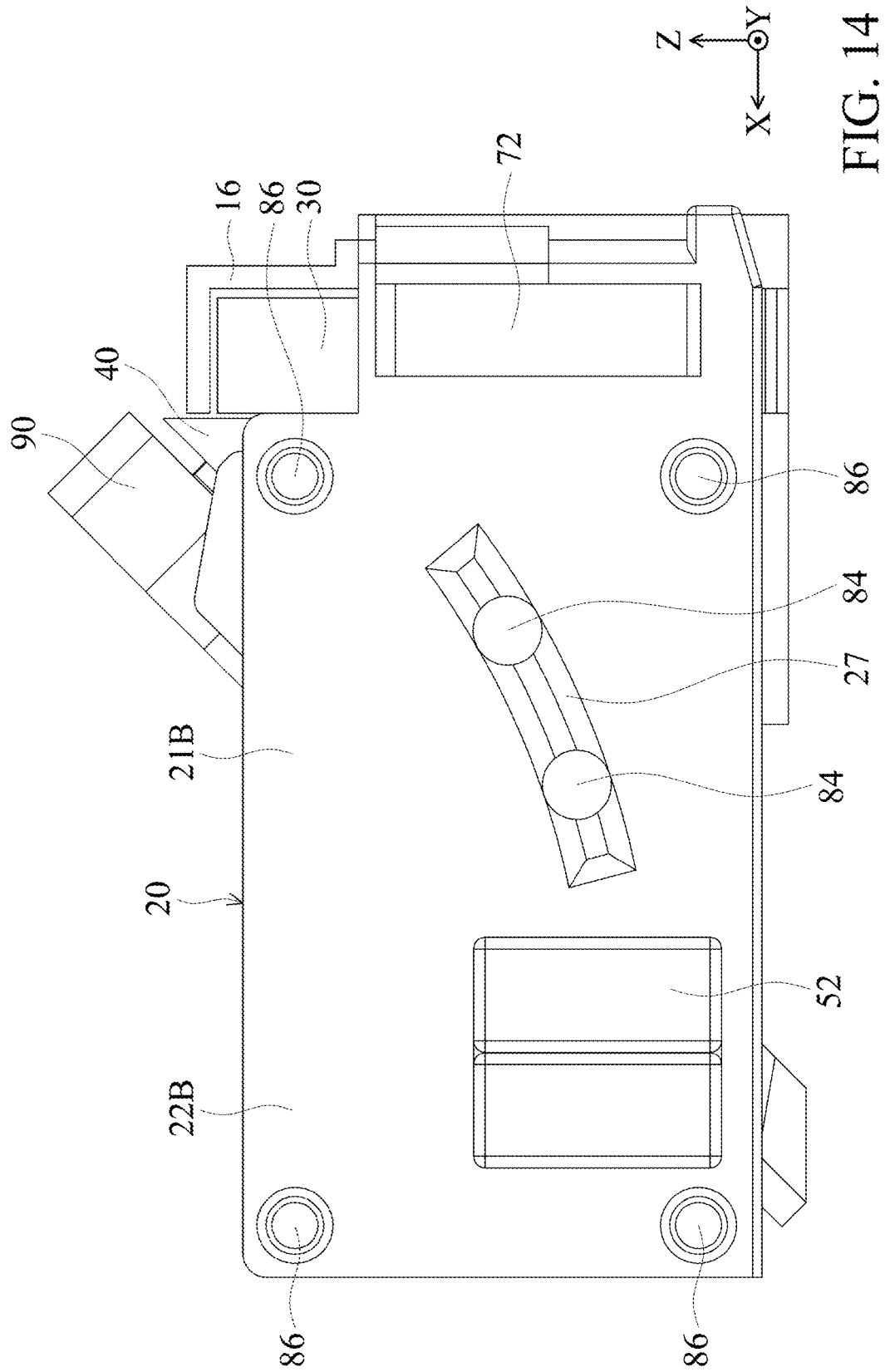

FIG. 11 and FIG. 12 are schematic views of some elements of the optical element driving mechanism 100 viewed in different directions. FIG. 13 and FIG. 14 are schematic views of some elements of the optical element driving mechanism 100 viewed in different directions. The sidewall 14, the first coil 62, the second circuit element 76, and the second strengthen element 78 are omitted in FIG. 13 and FIG. 14.

In some embodiments, the first magnetic element 52 of the first driving assembly D1 may be disposed on the first movable portion M1 (e.g. the frame 20), and the first coil 62 of the first driving assembly D1 may be disposed on the fixed portion F (e.g. the sidewall 14). When power is provided to the first coil 62, a first driving force may be generated between the first magnetic element 52 and the first coil 62 to move the first movable portion M1 relative to the fixed portion F in the first dimension. The second guiding element 84 disposed in the third guiding recess 27 may be used to define the moving direction of the first movable portion M1 relative to the fixed portion F. For example, in some embodiments, the second guiding element 84 may be affixed on the sidewall 14 and movably connected to the frame 20. Moreover, the spherical second guiding element 84 may be used for reducing the friction between the first movable portion M1 and the fixed portion F when the first movable portion M1 moves relative to the fixed portion F.

In some embodiments, the transmission element 30 of the second driving assembly D2 is disposed between the first movable portion M1 and the second movable portion M2, so the second driving force generated by the second driving assembly D2 may be transferred to the second movable portion M2. For example, the second magnetic element 54 may be disposed on the transmission element 30, and the second coil 64 may be disposed on the frame 20. In some embodiments, when power is provided to the second coil 64, a second driving force may be generated between the second magnetic element 54 and the second coil 64 to move the second movable portion M2 relative to the first movable portion M1 in the second dimension. In detail, the second driving force generated between the second magnetic element 54 and the second coil 64 may move the transmission element 30 in the third dimension, such as the translational movement in the Z direction, and the third dimension is different from the first dimension and the second dimension. In some embodiments, gear or rack structures (not shown) may be provided between the transmission element 30 and the holding element 40 to allow the transmission element 30 moving in the third dimension brings the holding element 40 to move in the second dimension.

In some embodiments, a blocking element 16 may be disposed on the frame 20 to define the movable range of the transmission element 30. For example, in the second direction and the third direction, at least a portion of the blocking element 16 overlaps the transmission element 30. Moreover, as shown in FIG. 3, when viewed in the third direction (the Z direction), at least a portion of the first guiding recess 24A and the fourth guiding recess 31 expose from the blocking element 16, and the second guiding recess 24B and the fifth guiding recess 32 do not expose from the blocking element 16. In other words, the second guiding recess 24B and the fifth guiding recess 32 may at least partially overlap the blocking element 16. Therefore, the maximum movable range of the transmission element 30 relative to the frame 20 in the Z direction may be defined, and the recesses may be protected.

The first circuit element 72, the first strengthen element 74, the second circuit element 76, and the second strengthen element 78 may be disposed on the fixed portion F, the first circuit element 72 and the first strengthen element 74 may be disposed on the first side 21A of the frame 20, and the second circuit element 76 and the second strengthen element 78 may be disposed between the second side 21B of the frame 20 and the sidewall 14. When viewed from the first direction (the Y direction), at least a portion of the first circuit element 72 and the second circuit element 76 overlap the frame 20, and at least a portion of the second circuit element 76 and the second strengthen element 78 expose from the sidewall 14.

In some embodiments, in the second direction (the X direction), at least a portion of the first circuit element 72 overlaps the frame 20. Moreover, in some embodiments, at least a portion of the first circuit element 72 overlaps the first strengthen element 74 in the second direction, and at least a portion of the second circuit element 76 overlaps the second strengthen element 78 in the first direction. Therefore, the strength of the structure may be enhanced to protect the first circuit element 72 and the second circuit element 76.

In some embodiments, the first circuit element 72 and the second circuit element 76 may be flexible printed circuits (FPC) adhered on the fixed portion F. In this embodiment, the first circuit element 72 and the second circuit element 76 are electrically connected to other electronic elements disposed inside or outside the optical element driving mechanism 100. For example, in some embodiments, an electric signal may be transfer to the first driving assembly D1 or the second driving assembly D2 through the first circuit element 72 or the second circuit element 76 to control the movement of the first movable portion M1 or the second movable portion M2 in different directions to achieve optical image stabilization.

Figure 15:
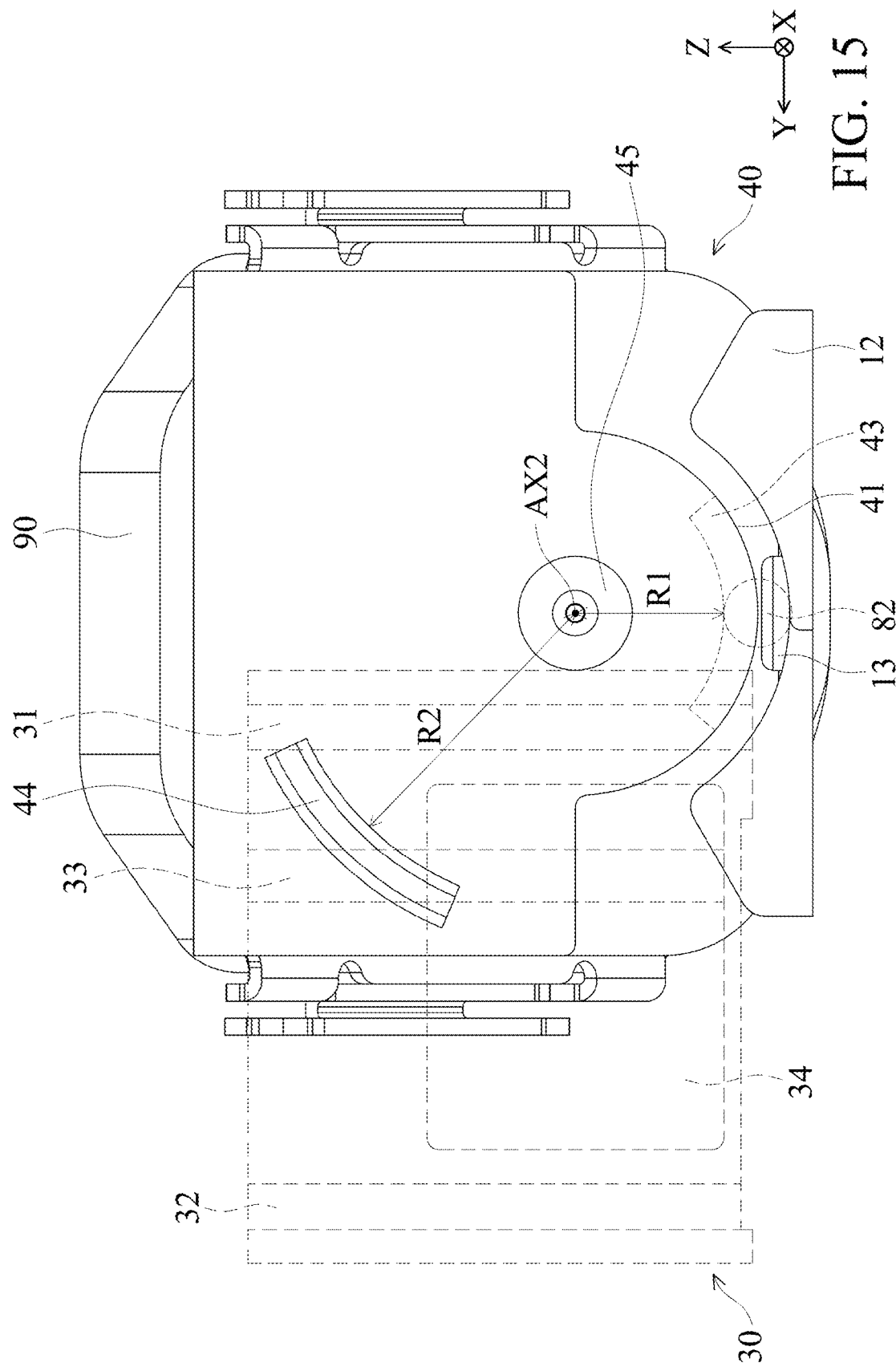
FIG. 15 is a schematic view of some elements of the optical element driving mechanism.

FIG. 15 is a schematic view of some elements of the optical element driving mechanism 100. As shown in FIG. 15, when viewed in the second direction (the X direction), the sixth guiding recess 33 may at least partially overlap the second recess 44 of the holding element 40. In some embodiments, corresponding gear or rack structures may be disposed in the sixth guiding recess 33 and the second recess 44 to allow the transmission element 30 bring the holding element 40 to move. Since the sixth guiding recess 33 extends in the third direction (the Z direction), and the second recess 44 has a structure with the second axis AX2 as the center axis, when the transmission element 30 moves in the Z direction, the holding element 40 is moved by the transmission element 30 in the second dimension (rotational movement with the second axis AX2 as a rotational axis). In some embodiments, when viewed in the second direction (the X direction), the first recess 43 has a first radius of curvature R1, the second recess 44 has a second radius of curvature R2, and the first radius of curvature R1 and the second radius of curvature R2 are different. For example, the first radius of curvature R1 may be less than the second radius of curvature R2. Therefore, the size of the optical element driving mechanism 100 may be designed with more flexibility.

Figure 16:
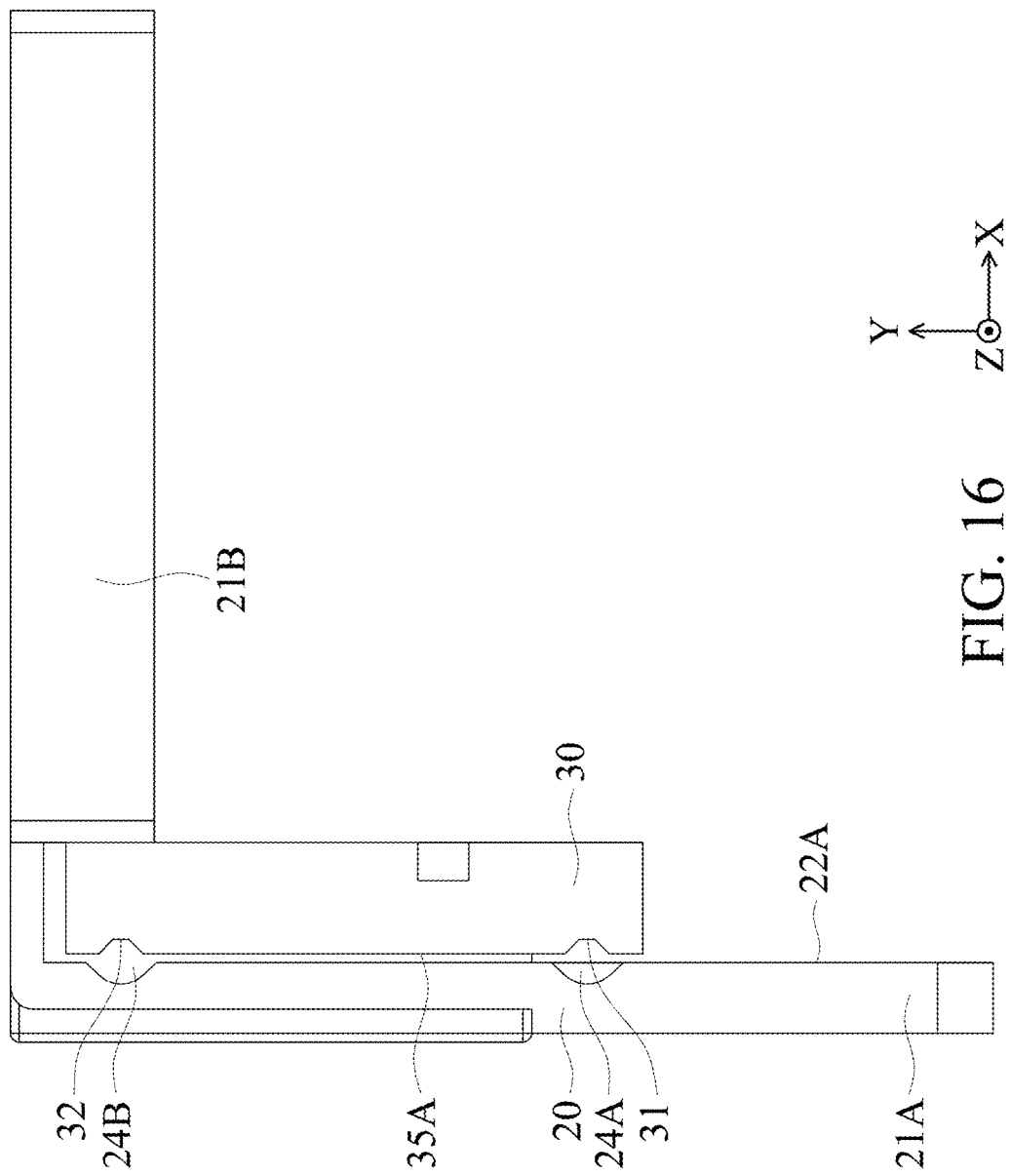
FIG. 16 is a schematic view of the frame and the transmission element.

FIG. 16 is a schematic view of the frame 20 and the transmission element 30. As shown in FIG. 16, the third surface 35A of the transmission element 30 faces the first surface 22A of the frame 20. Moreover, in the second direction (the X direction), at least a portion of the fourth guiding recess 31 and the fifth guiding recess 32 of the transmission element 30 overlap the first guiding recess 24A and the second guiding recess 24B of the frame 20, respectively. In some embodiments, additional connecting element (not shown) may be disposed in the overlapped guiding recesses, such as balls. Therefore, the frame 20 may be movably connected to the transmission element 30.

In summary, an optical element driving system is provided. The optical element driving system includes a fixed portion, a first movable portion, a second movable portion, a first driving assembly, a second driving assembly, and a connecting element. The first movable portion is used for moving relative to the fixed portion. The second movable portion is used for holding an optical element having a main axis, and is movable relative to the first movable portion. The first driving assembly is used for driving the first movable portion to move relative to the fixed portion in a first dimension. The second driving assembly is used for driving the second movable portion to move relative to the first movable portion in a second dimension. The connecting element connects the first movable portion and the second movable portion. Therefore, the optical element may be driven in various directions to achieve optical image stabilization.

The relative positions and size relationship of the elements in the present disclosure may allow the optical element driving mechanism achieving miniaturization in specific directions or for the entire mechanism. Moreover, different optical modules may be combined with the optical element driving mechanism to further enhance optical quality, such as the quality of photographing or accuracy of depth detection. Therefore, the optical modules may be further utilized to achieve multiple anti-vibration systems, so image stabilization may be significantly improved.

Although embodiments of the present disclosure and their advantages already have been described in detail, it should be understood that various changes, substitutions and alterations may be made herein without departing from the spirit and the scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are also intended to include within their scope of such processes, machines, manufacture, and compositions of matter, means, methods, or steps. In addition, each claim herein constitutes a separate embodiment, and the combination of various claims and embodiments are also included within the scope of the disclosure.

What is claimed is:

1. An optical element driving mechanism, comprising:
 a fixed portion;
 a first movable portion disposed in the fixed portion and used for moving relative to the fixed portion;
 a second movable portion disposed in the fixed portion and used for holding an optical element having a main axis, and the second movable portion is movable relative to the first movable portion;
a first driving assembly disposed in the fixed portion and used for driving the first movable portion to move relative to the fixed portion in a first dimension;
a second driving assembly disposed in the fixed portion and used for driving the second movable portion to move relative to the first movable portion in a second dimension; and
a connecting element connecting the first movable portion and the second movable portion;
wherein:
movement in the first dimension is a circular movement of the first movable portion relative to a first axis extending in a first direction;
movement in the second dimension is a rotational movement of the second movable portion relative to a second axis extending in a second direction;
wherein the second driving assembly comprises a first transmission element disposed between the first movable portion and the second movable portion, used for transmitting a second driving force generated by the second driving assembly to the second movable portion;
wherein:
the first dimension and the second dimension are different;
the transmission element moves in a third dimension, wherein the third dimension is different from the first dimension and the second dimension.

2. The optical element driving mechanism as claimed in claim 1, wherein:
the first direction and the second direction are different;
the second axis passes through the second movable portion;
the main axis is not parallel to the first direction;
the main axis is not parallel to the second direction;
the optical element and the second movable portion are arranged in the main axis.

3. The optical element driving mechanism as claimed in claim 2, wherein:
the first movable portion comprises a frame;
the second axis passes through the connecting element;
the fixed portion comprises a bottom, a first guiding element is disposed on the bottom, and the second movable portion is movably connected to the bottom through the first guiding element.

4. The optical element driving mechanism as claimed in claim 3, wherein:
the second movable portion comprises a holding element used for holding the optical element;
the holding element comprises a first recess and a second recess;
the bottom comprises a limiting portion, and at least a portion of the first guiding element is disposed in the limiting portion.

5. The optical element driving mechanism as claimed in claim 4, wherein:
a distance greater than zero is between the limiting portion and the holding element;
the holding element has a first surface and a second surface;
the first recess is at the first surface of the holding element;
the second recess is at the second surface of the holding element;
the first surface faces the bottom;
the second surface faces the transmission element;
the second surface faces the frame;
the main axis passes through the first guiding element.

6. The optical element driving mechanism as claimed in claim 5, wherein:
the first surface and the second surface face different directions;
the first surface is a curved surface with the first axis as a central axis;
the first recess has a curved structure with the first axis as a central axis;
the second recess has a curved structure with the first axis as a central axis;
the first recess has a first radius of curvature when viewed in the second direction;
the second recess has a second radius of curvature when viewed in the second direction;
the first radius of curvature and the second radius of curvature are different.

7. The optical element driving mechanism as claimed in claim 6, wherein:
the holding element further comprises a holding surface perpendicular to the main axis;
when the holding element moves in the second dimension relative to the first movable portion, the holding surface is perpendicular to the main axis.

8. The optical element driving mechanism as claimed in claim 7, wherein:
the first movable portion comprises a frame;
the frame comprises a first side and a second side;
a first guiding recess and a second guiding recess are formed on a first surface of the first side;
a third guiding recess is formed on a second surface of the second side;
the first guiding recess and the second guiding recess extend in a third direction;
the third direction is different from the first direction and the second direction;
the third guiding recess has a curved structure with the second axis as a central axis.

9. The optical element driving mechanism as claimed in claim 8, wherein:
the fixed portion further comprises a case and a sidewall;
the first movable portion and the second movable portion are disposed in the case;
the sidewall is disposed between the case and the first movable portion;
at least a portion of the sidewall overlaps the frame in the first direction.

10. The optical element driving mechanism as claimed in claim 9, further comprising:
a second guiding element disposed in the third guiding recess; and
a plurality of positioning element disposed between the sidewall and the frame.

11. The optical element driving mechanism as claimed in claim 10, wherein:
the third direction is perpendicular to the first direction and the second direction;
a plurality of accommodating portions are formed on the second side of the frame;
a plurality of positioning portions are formed on the sidewall;
at least a portion of the positioning portions overlap the accommodating portion in the first direction;
at least a portion of the positioning elements is disposed in the guiding portion and the positioning portions.

12. The optical element driving mechanism as claimed in claim 11, wherein:
the positioning elements are spherical shaped;
the second guiding element are spherical shaped;
at least a portion of the second guiding element is exposed from the frame when viewed from the third direction;
at least a portion of the positioning element is exposed from the frame when viewed from the third direction.

13. The optical element driving mechanism as claimed in claim 12, wherein:
the transmission element comprises a third surface and a fourth surface;
the third surface and the fourth surface are opposite;
a fourth guiding recess and a fifth guiding recess are formed on the third surface;
a sixth guiding recess is formed on the fourth surface;
the third surface of the transmission element faces the first surface of the frame;
at least a portion of the second recess of the holding element overlaps the sixth guiding recess of the transmission element in the second direction.

14. The optical element driving mechanism as claimed in claim 13, wherein:
corresponding gear or rack structures are provided in the second recess of the holding element and the sixth guiding recess of the transmission element;
in the second direction, the fourth guiding recess and the fifth guiding recess of the transmission element at least partially overlap the first guiding recess and the second guiding recess of the frame, respectively;
at least a portion of the positioning elements expose from the positioning portions when viewed in the third direction.

15. The optical element driving mechanism as claimed in claim 14, further comprising:
a blocking element disposed on the frame; and
a gasket disposed between the connecting element and the frame.

16. The optical element driving mechanism as claimed in claim 15, wherein:
when viewed in the second direction, at least a portion of the blocking element overlaps the transmission element;
when viewed in the third direction, at least a portion of the blocking element overlaps the transmission element;
when viewed in the third direction, at least a portion of the first guiding recess is exposed from the blocking element;
when viewed in the third direction, at least a portion of the fourth guiding recess is exposed from the blocking element;
when viewed in the third direction, at least a portion of the second guiding recess overlaps the blocking element;
when viewed in the third direction, at least a portion of the fifth guiding recess overlaps the blocking element.

17. The optical element driving mechanism as claimed in claim 16, further comprising:
a first circuit element disposed on the fixed portion;
a second circuit element disposed on the fixed portion;
a first strengthen element disposed on the fixed portion; and
a second strengthen element disposed on the fixed portion.

18. The optical element driving mechanism as claimed in claim 17, wherein:
in the first direction, at least a portion of the first circuit element overlaps the frame;
in the second direction, at least a portion of the first circuit element overlaps the frame;
in the first direction, at least a portion of the second circuit element overlaps the frame;
in the second direction, at least a portion of the first circuit element overlaps the first strengthen element;
in the first direction, at least a portion of the second circuit element overlaps the second strengthen element.

* * * * *